United States Patent
Balakrishnan et al.

(10) Patent No.: US 9,515,194 B2
(45) Date of Patent: Dec. 6, 2016

(54) NANO-RIBBON CHANNEL TRANSISTOR WITH BACK-BIAS CONTROL

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/670,588

(22) Filed: Mar. 27, 2015

(65) Prior Publication Data

US 2016/0284866 A1    Sep. 29, 2016

(51) Int. Cl.
*H01L 27/12* (2006.01)
*H01L 29/786* (2006.01)
*H01L 29/66* (2006.01)
*H01L 29/423* (2006.01)
*H01L 29/06* (2006.01)

(52) U.S. Cl.
CPC ..... *H01L 29/78696* (2013.01); *H01L 29/0649* (2013.01); *H01L 29/42392* (2013.01); *H01L 29/66742* (2013.01); *H01L 29/78618* (2013.01); *H01L 29/78681* (2013.01)

(58) Field of Classification Search
CPC .......... H01L 29/78696; H01L 29/0649; H01L 29/42392; H01L 29/66742; H01L 29/78618; H01L 29/78681

USPC ......................................................... 257/347
See application file for complete search history.

(56) References Cited

U.S. PATENT DOCUMENTS

| | | | |
|---|---|---|---|
| 7,091,566 B2 | 8/2006 | Zhu et al. | |
| 7,498,211 B2 | 3/2009 | Ban et al. | |
| 7,621,997 B2 | 11/2009 | Jun et al. | |
| 8,274,118 B2 | 9/2012 | Xiao et al. | |
| 8,686,514 B2 | 4/2014 | Guo et al. | |
| 2011/0253982 A1 | 10/2011 | Wang et al. | |
| 2011/0315950 A1* | 12/2011 | Sleight | B82Y 10/00 257/9 |
| 2013/0140612 A1* | 6/2013 | Sun | H01L 29/785 257/288 |
| 2014/0097502 A1 | 4/2014 | Sun et al. | |

(Continued)

FOREIGN PATENT DOCUMENTS

JP     2014131044    7/2014

*Primary Examiner* — Matthew Gordon
(74) *Attorney, Agent, or Firm* — Edward J. Wixted, III

(57) ABSTRACT

Embodiments of the invention include a method for fabricating a nano-ribbon transistor device and the resulting structure. A nano-ribbon transistor device including a substrate, a nano-ribbon channel, a core region in the center of the nano-ribbon channel, a gate formed around the nano-ribbon channel, a spacer formed on each sidewall of the gate, and a source and drain region epitaxially formed adjacent to each spacer is provided. The core region in the center of the nano-ribbon channel is selectively etched. A dielectric material is deposited on the exposed portions of the nano-ribbon channel. A back-bias control region is formed on the dielectric material within the core of the nano-ribbon channel and on the substrate adjacent to the nano-ribbon transistor device. A metal contact is formed in the back-bias control region.

7 Claims, 7 Drawing Sheets

(56) References Cited

U.S. PATENT DOCUMENTS

2014/0183452 A1* 7/2014 Hirai .................... H01L 29/778
257/24

* cited by examiner

NANO-RIBBON CHANNEL TRANSISTOR WITH BACK-BIAS CONTROL

BACKGROUND OF THE INVENTION

The present invention relates generally to the field of transistors, and more particularly to controlling the threshold voltage of three-dimensional transistor devices using back-side control.

With the down scaling of integrated circuits and higher requirements for the number of transistors present in integrated circuits, transistors need to have higher drive currents with progressively smaller dimensions. In its basic form, a nano-ribbon transistor device includes a source, a drain and one or more ribbon-shaped channels between the source and the drain. A gate electrode over the channel(s) regulates electron flow between the source and the drain. In general, nano-ribbon transistor designs facilitate manufacturing smaller and smaller transistors, however controlling the fabrication steps required to create sufficiently small transistors is often problematic.

SUMMARY

Embodiments of the invention disclose a semiconductor device and a method of forming a semiconductor device. A nano-ribbon transistor device including a substrate, a nano-ribbon channel, a core region in the center of the nano-ribbon channel, a gate formed around the nano-ribbon channel, a spacer formed on each sidewall of the gate, and a source and drain region epitaxially formed adjacent to each spacer is provided. The core region in the center of the nano-ribbon channel is selectively etched. A dielectric material is deposited on the exposed portions of the nano-ribbon channel. A back-bias control region is formed on the dielectric material within the core of the nano-ribbon channel and on the substrate adjacent to the nano-ribbon transistor device. A metal contact is formed in the back-bias control region.

DETAILED DESCRIPTION

Embodiments of the present invention generally provide a method for controlling the threshold voltage of a three-dimensional transistor device. A detailed description of embodiments of the claimed structures and methods are included herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale; some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the Figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Figure 1:
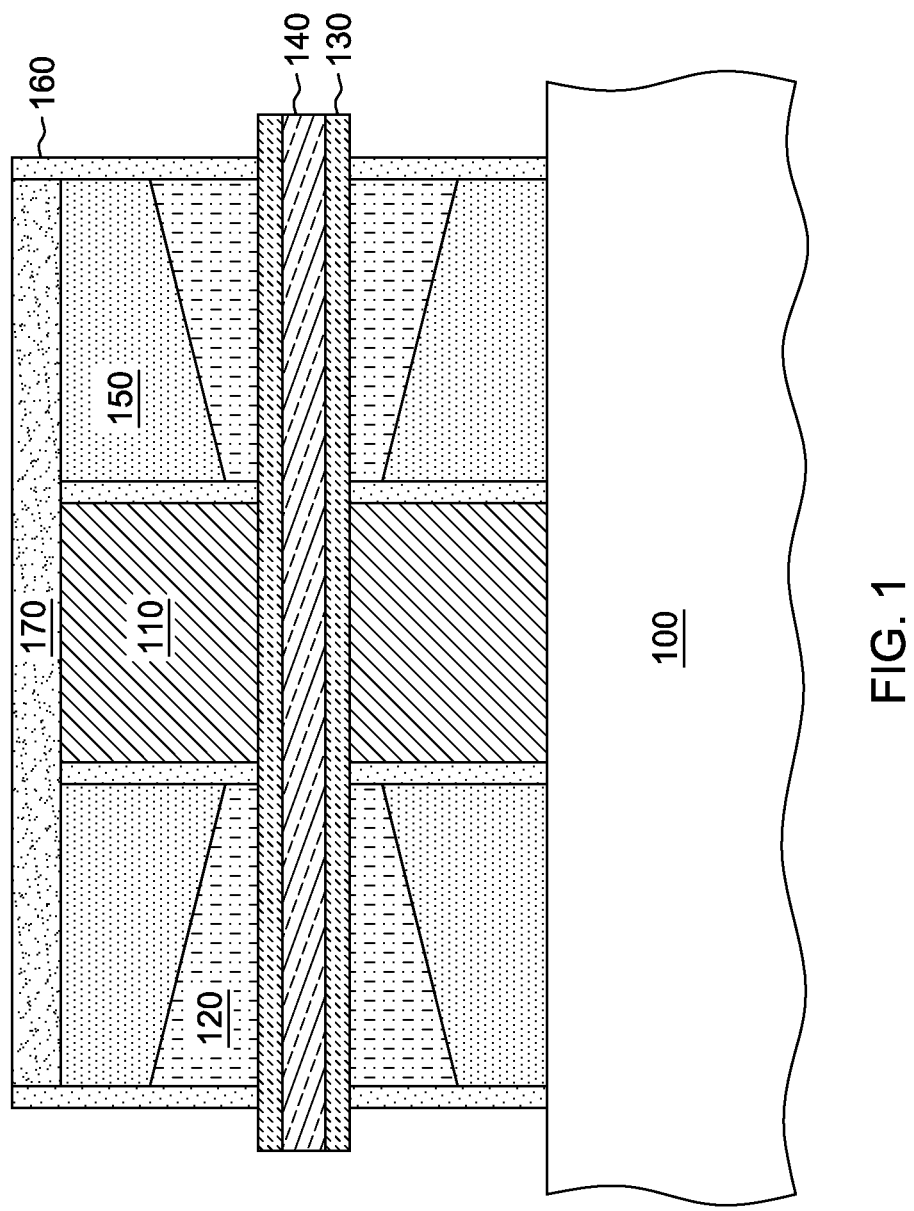
FIG. 1 illustrates a section view of a starting wafer including a semiconductor substrate and a nano-ribbon transistor device on which the invention is formed, in accordance with an embodiment of the invention.

The present invention will now be described in detail with reference to the Figures. FIG. 1 illustrates a section view of a starting wafer and nano-ribbon channel transistor including semiconductor substrate 100, dummy gate 110, source and drain region 120, wrap-around channel 130, dummy core 140, interlayer dielectric 150, spacer 160, and hard mask 170, in accordance with an embodiment of the invention. Semiconductor substrate 100 is a substrate on which a nano-ribbon transistor device may be formed. In some embodiments, semiconductor substrate 100 is a semiconductor material such as, but not limited to, silicon, germanium, silicon germanium alloys, germanium alloys, indium alloys, silicon carbon alloys, or silicon germanium carbon alloys. In other embodiments, semiconductor substrate 100 is a III-V semiconductor material such as Indium Phosphide (InP), Gallium Arsenide (GaAs), Gallium Nitride (GaN), or Indium Gallium Arsenide (InGaAs). It should be appreciated that any semiconducting material suitable for manufacturing transistor devices can be used to form semiconductor substrate 100 in various embodiments of the invention.

In various embodiments, both NFET and PFET transistors may be constructed on the same wafer, and as a result different processing steps are required for the formation of NFETs and PFETs. It should be appreciated that the embodiment depicted in FIG. 1 is meant to illustrate the processing steps required to form an embodiment of the invention incorporating an NFET transistor, and is not intended to be limiting. In various embodiments, any number of NFET and PFET transistors may be present on the same wafer.

In some embodiments, a buried oxide layer (BOX) is present within semiconductor substrate 100. In general, this buried oxide layer acts as an electrical insulator below the nano-ribbon transistor device formed in various embodiments of the invention. In general, the thickness of semiconductor substrate 100 is between 100 μm and 1000 μm in various embodiments of the invention. While the depicted embodiment includes an illustration of bulk silicon construction, it should be appreciated by one skilled in the art that the invention is not limited to bulk silicon construction, and that other types of semiconductor substrates can be used in various embodiments of the invention, for example, silicon on insulator (SOI) construction. In embodiments where bulk silicon construction is used (such as the embodiment depicted in FIG. 1), a buried oxide layer may not be present in the starting wafer.

Dummy gate 110 is used to define the shape of the gate terminal of the nano-ribbon transistor device formed in the following steps. In one embodiment, dummy gate 110 is composed of a thin oxide layer between 1 and 4 nanometers thick adjacent to channel 130 and spacer 160 and internally filled with polysilicon, deposited using, for example, low pressure chemical vapor deposition (LPCVD). Other materials of which dummy gate 110 may be formed include, but are not limited to, silicon oxide, silicon oxide doped with carbon, titanium oxide, hafnium oxide, any other insulative material. It should be appreciated that the process of forming a dummy gate for a transistor device is well known in the art, and that any acceptable method of forming a dummy gate can be used in various embodiment of the invention. In general, dummy gate 110 is used to define the shape of the metal gate formed in proceeding fabrication steps, and that dummy gate 110 is not intended to act as a functional component of the device.

Each source and drain region 120 serves as either a source or drain terminal of the device, in accordance with an embodiment of the invention. In embodiments such as the depicted embodiment where the current device is an n-type nano-ribbon transistor device, source and drain region 120 is composed of silicon doped with n-type dopants such as phosphorus. In embodiments where the current device is a p-type nano-ribbon transistor device, source and drain region 120 is composed of silicon doped with a p-type dopant such as boron. In general, source and drain region 120 is composed of a material with an opposite conductivity type of the material of which channel 130 is composed. In general, one source and drain region 120 is present on each sides of dummy gate 110. For each pair of source and drain region 120, one source and drain region 120 will act as the source terminal while the other source and drain region 120 located on the other side of dummy gate 110 will act as the drain terminal for the given nano-ribbon transistor device. It should be appreciated that the shape of each source and drain region 120 is not limited to the trapezoidal shape depicted in FIG. 1, and that in other embodiments source and drain region 120 may have a rectangular shape, a triangular shape, a rounded shape, or any other acceptable shape for a source or drain region of a transistor device. In general the shape of source and drain region 120 is determined by the epitaxial growth conditions, the material of which source and drain region 120 is formed, and the crystallographic orientation of channel 130.

Channel 130 is a nano-ribbon semiconductor channel wrapped around a dummy core 140. In various embodiments of the invention, the nano-wire containing dummy core 140 and channel 130 is created using one of the methods well-known in the art for creating a nano-wire including an outer semiconducting shell. In one embodiment of the invention, In some embodiments, such as the depicted embodiment, the current nano-ribbon transistor device being created is an n-type nano-ribbon transistor device including a p-type channel and n-type contacts for source and drain. In such embodiments, channel 130 is composed of undoped silicon or silicon doped with p-type dopants such as boron. In some embodiments the current nano-ribbon transistor device is a p-type FET including an n-type fin and p-type contacts for source and drain. In such embodiments, channel 130 is composed of undoped silicon or silicon doped with n-type dopants such as phosphorus. Other materials of which channel 130 may be formed include, but are not limited to germanium, III-V semiconductor materials, II-IV semiconductor materials, carbon, silicon carbide, or silicon-germanium alloy materials. As depicted in FIG. 1, channel 130 and dummy core 140 extend laterally outwards beyond the sides of the rest of the semiconductor device, and are etched in the following steps to remove portions of channel 130 and dummy core 140 which are present beyond the outside edges of spacer 160. It should be appreciated that dummy gate 110 and source and drain region 120 are each formed around channel 130. Additionally, it should be appreciated that FIG. 1 illustrates a section view of the nano-ribbon transistor device, and that the appearance of dummy gate 110 and source and drain region 120 as being present above and below channel 130 is a result of the section view, and is not meant to indicate the position of either dummy gate 110 or source and drain region 120.

Dummy core 140 is a portion of semiconductor material which is present within the core of channel 130. In various embodiments, dummy core 140 is composed of any material which has etch selectivity to the material of which channel 130 and spacer 160 is formed. In preferred embodiments, it is possible to selectively etch the material of which dummy core 140 is formed without removing any portion of the material of which channel 130 or spacer 160 are formed.

Interlayer dielectric 150 is used to electrically insulate the current nano-ribbon transistor device from outside electrical components. In a preferred embodiment, interlayer dielectric 150 is composed of silicon dioxide, deposited using, for example, low pressure chemical vapor deposition (LPCVD). Other materials of which Interlayer dielectric 150 may be formed include, but are not limited to, doped carbon, silicon oxynitride, or any other insulative material. In general, Interlayer dielectric 150 extends vertically from the top of semiconductor substrate 100 to the top of spacer 160. A person of ordinary skill in the art will recognize that chemical-mechanical planarization (CMP) steps may be required after the deposition of the material of which Interlayer dielectric 150 is formed to planarize the top of Interlayer dielectric 150 such that the top of Interlayer dielectric 150 is even with the top of spacer 160 and no portions of Interlayer dielectric 150 are present above the top of spacer 160.

Spacer 160 is a portion of insulating material used to electrically isolate the different regions included in the nano-ribbon transistor device of the invention. For example, forming spacer 160 may include depositing a conformal layer (not shown) of insulating material, such as silicon nitride, over the existing elements of the nano-ribbon transistor device, such that the thickness of the deposited layer on the sidewall of dummy gate 110, source and drain region 120, and interlayer dielectric 150 is substantially the same as the thickness of the deposited layer on the surface of semiconductor substrate 100. An anisotropic etch process, where the etch rate in the downward direction is greater than the etch rate in the lateral directions, may be used to remove portions of the insulating layer, thereby forming spacer 160. In some embodiments, a combination of an anisotropic etch and a wet etch is used to remove portions of spacer 160 present below channel 130. The etch process can be controlled such that the insulating layer may be removed from the sidewall of dummy gate 110, source and drain region 120, and interlayer dielectric 150 while forming spacer 160.

Hard mask 170 is a layer of material used to define the desired shape of the nano-ribbon transistor device of the invention and to protect the nano-ribbon transistor device during subsequent fabrication steps. In various embodiments, hard mask 170 is composed of, for example, a dielectric material such as silicon nitride (SiN), silicon dioxide ($SiO_2$), or a combination of SiN and $SiO_2$.

Figure 2:
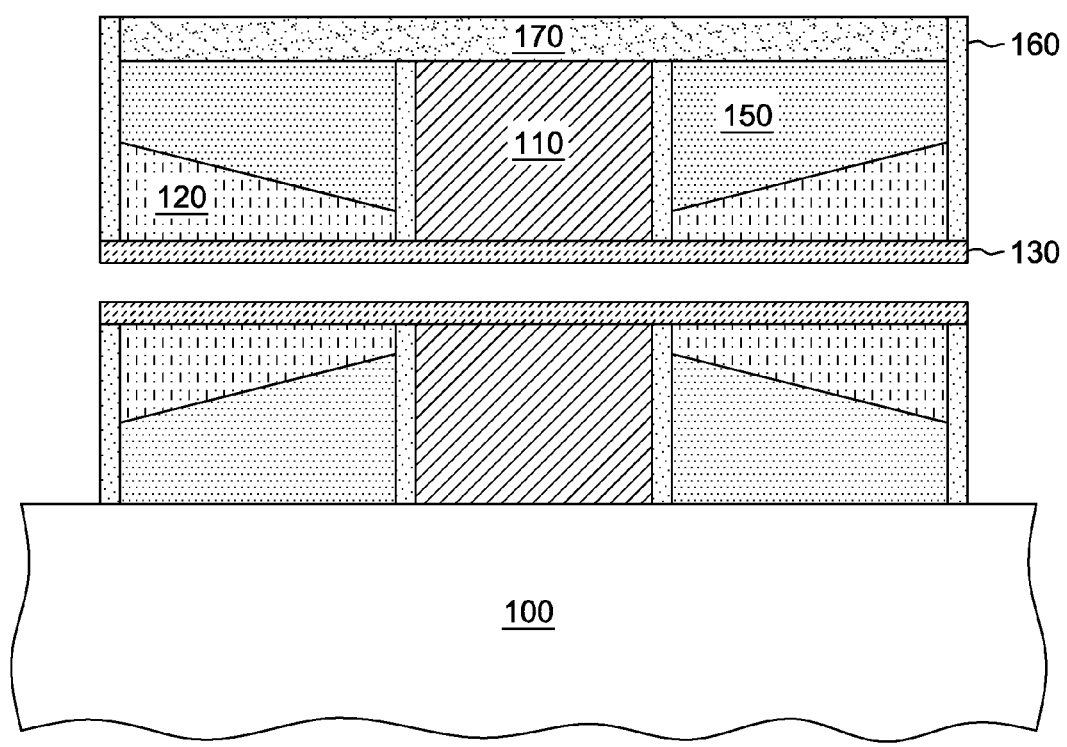
FIG. 2 illustrates a section view of the removal of a dummy core of the nano-ribbon transistor device of FIG. 1, in accordance with an embodiment of the invention.

FIG. 2 illustrates a section view of the nano-ribbon transistor device after the removal of portions of channel 130 and dummy core 140 present beyond the outside edges of spacer 160 and the selective removal of dummy core 140, in accordance with an embodiment of the invention. In one embodiment, an anisotropic etch process, such as anisotropic reactive ion etching (RIE), where the etch rate in the downward direction is greater than the etch rate in the lateral directions, may be used to remove portions of channel 130 and dummy core 140 present beyond the edge of spacer 160, thereby forming the trimmed nano-ribbon depicted in FIG. 2. RIE uses chemically reactive plasma, generated by an electromagnetic field, to remove various materials. A person of ordinary skill in the art will recognize that the type of plasma used will depend on the material of which channel 130 and dummy core 140 are composed, and that other etch processes such as wet chemical etching or laser ablation may be used. The etch process can be controlled such that only portions of channel 130 and dummy core 140 are removed during the etch process, and that all other components of the semiconductor device depicted in FIG. 1 are not removed.

In one embodiment, the process of selectively removing dummy core 140 involves the use of a wet chemical etch. For example, in an embodiment where dummy core 140 is composed of silicon and channel 130 is composed of germanium, a wet chemical etch using tetramethylammonium hydroxide (TMAH) as an etchant is used to selectively remove dummy core 140 without removing channel 130 or spacer 160.

Figure 3:
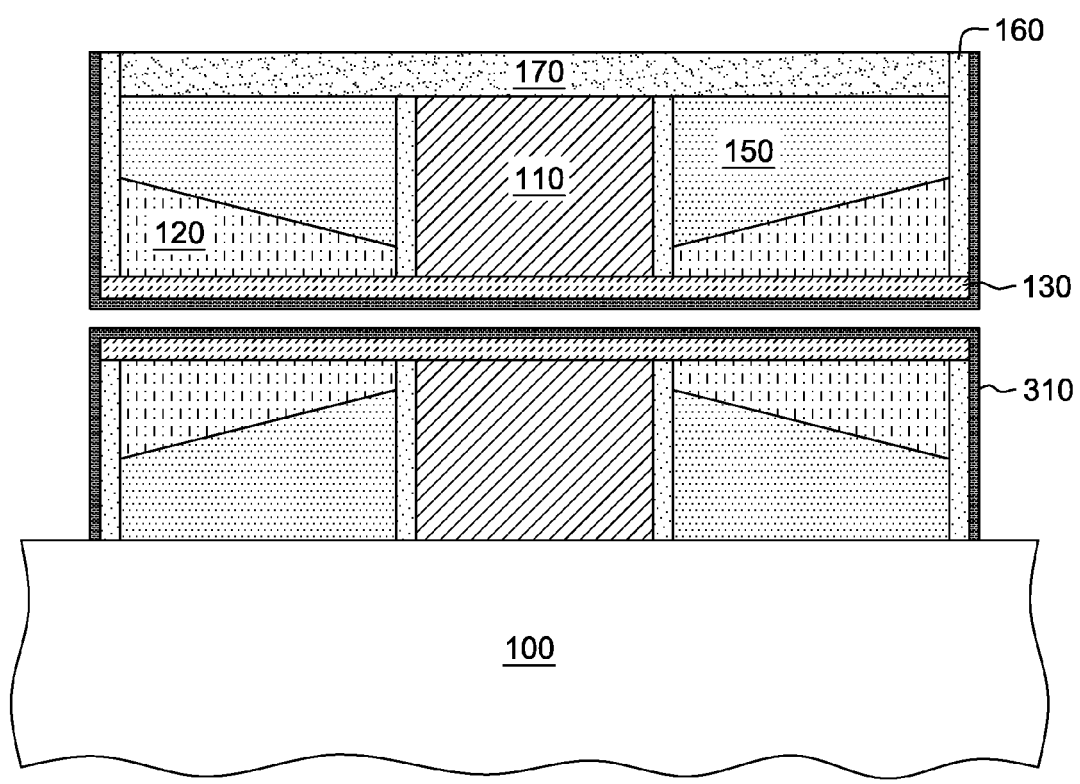
FIG. 3 illustrates a section view of the deposition of a dielectric layer on the exposed portions of the nano-ribbon transistor device of FIG. 1, in accordance with an embodiment of the invention.

FIG. 3 depicts a section view of the nano-ribbon transistor device after the deposition of dielectric layer 310, in accordance with an embodiment of the invention. In general, the purpose of dielectric layer 310 is to prevent electrical conduction between channel 130 and any material present on the other side of dielectric layer 310. Electric fields created by any material present within the core of channel 130 (and inside dielectric layer 310) must be able to pass through dielectric layer 310 in order for the device to function correctly, however direct electrical conduction must not be possible. In a preferred embodiment, dielectric layer 310 is composed of a low-k or medium-k dielectric such as Silicon dioxide ($SiO_2$) deposited using, for example, a process such as Atomic layer deposition (ALD). In general, dielectric layer 310 can be deposited using any process which will allow the deposited material to conform to the shape of the surface on which it is deposited and has good gap filling. It should be appreciated by one skilled in the art that additional etching and planarization steps may be required in some embodiments to remove a portion of dielectric layer 310 present on top of hard mask 170 in order to produce the semiconductor device depicted in FIG. 3.

Figure 4:
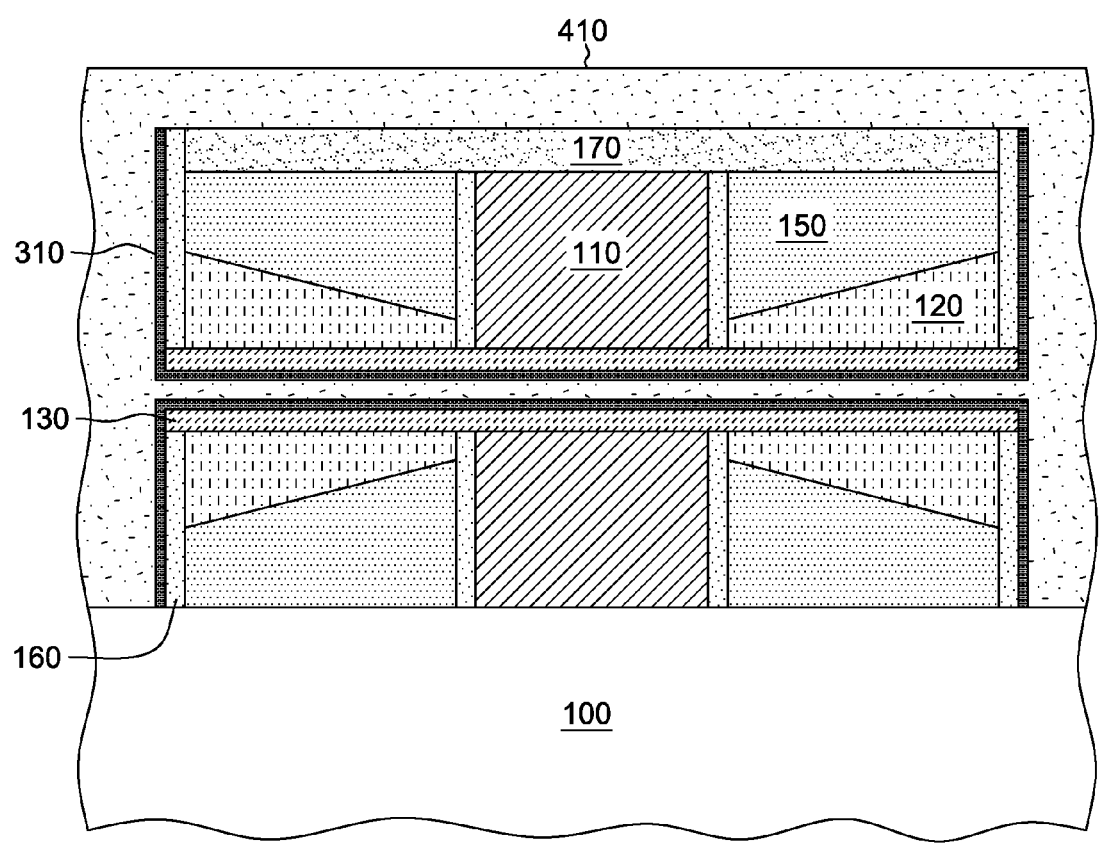
FIG. 4 illustrates a section view of the deposition of a metal layer on the exposed portions of the nano-ribbon transistor device of FIG. 1, in accordance with an embodiment of the invention.

FIG. 4 depicts a section view of the nano-ribbon transistor device after the deposition of metal layer 410, in accordance with an embodiment of the invention. In general, the purpose of metal layer 410 is to allow for the threshold voltage of the device (Vth) to be modified by applying a voltage to a contact present in the device (see FIG. 5). In various embodiments, the material of which metal layer 410 is composed can be any metal such as, Ti, Al, TiN, TiAlN, TaN, WN, W, TiC, TiCN, AlTiN, or any combination thereof. It general, metal layer 410 can be composed of any electrically conductive material. In a preferred embodiment, metal layer 410 is deposited using atomic layer deposition (ALD) to ensure that the area in the center of dielectric layer 310 is filled completely. Similarly to the deposition of dielectric layer 310, metal layer 410 can be deposited using any process which will allow the deposited material to conform to the shape of the surface on which it is deposited and has good gap filling. In some embodiments, there is a limit to the length of channel 130 and dielectric layer 310 which can be filled with metal layer 410 without the filling process "pinching off" and failing to fill the space present within dielectric layer 310 completely, as described in greater detail with respect to FIGS. 6 and 7. In some embodiments, the material of which metal layer 410 is formed is selected based on the work function of the desired work function of metal layer 410. For example, in an embodiment where two nano-ribbon transistor devices are desired with different threshold voltages, a first nano-ribbon transistor device is formed using Aluminum as the material of which metal layer 410 is formed while a second nano-ribbon transistor device is formed using Titanium Nitride as the material of which metal layer 410 is formed. Because the work function of Titanium Nitride (4.4 to 4.9 eV) is greater than the work function of Aluminum (4.1 eV), the second nano-ribbon transistor device will have a lower threshold voltage when an equal voltage is applied to the back bias contact of each device. In general, the selection of the material of which metal layer is 410 formed can be used to modify the threshold voltage of the nano-ribbon transistor device in a manner similar to using ion implantation to change the conductivity of channel 130.

Figure 5:
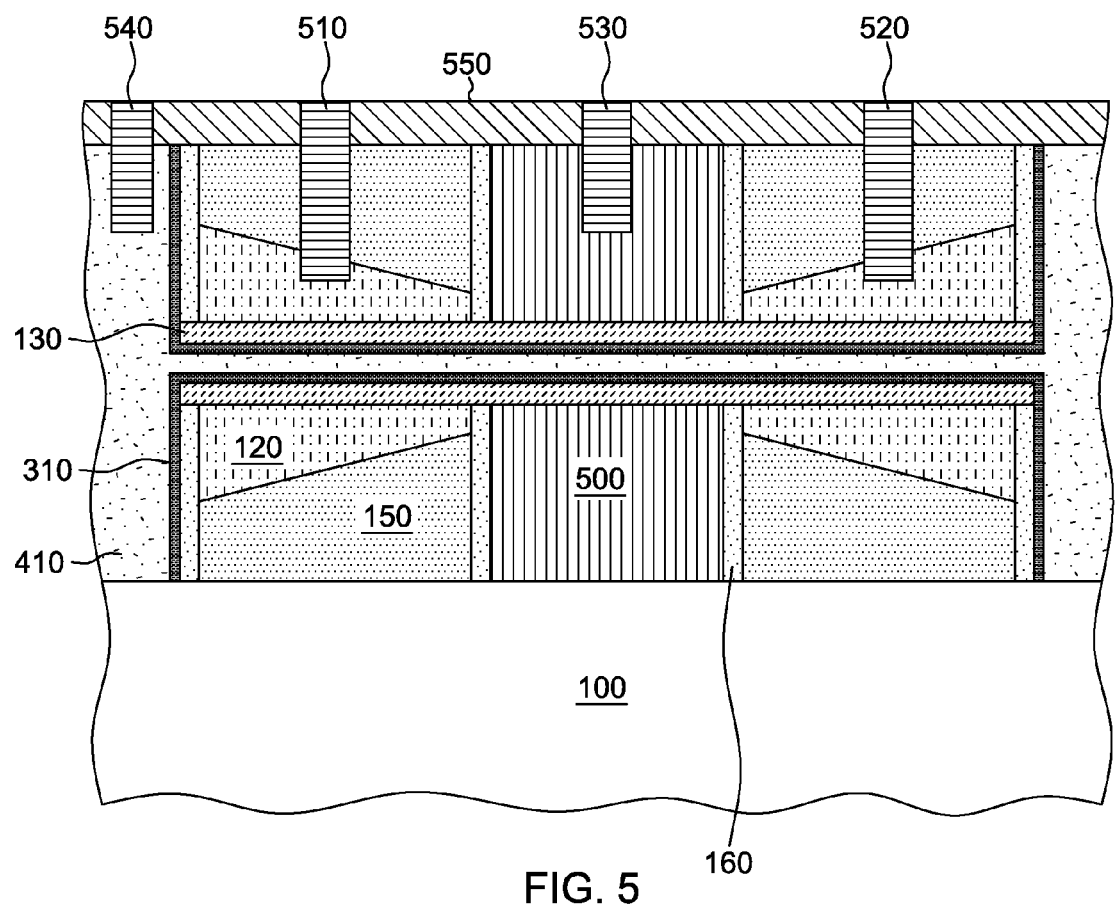
FIG. 5 illustrates a section view of the planarization of the metal layer of FIG. 4 and the formation of contacts for the nano-ribbon transistor device of FIG. 1.

FIG. 5 depicts a section view of the nano-ribbon transistor device after the use of planarization and etching processes to remove a portion of metal layer 410 and hard mask 170, the replacement of dummy gate 110 with gate structure 500 including a gate dielectric and a metal gate, the formation of contacts 510, 520, 530, and 540, and the deposition of interlayer dielectric 550, in accordance with an embodiment of the invention. In one embodiment, a process such as CMP is used to remove hard mask 170 and any portions of metal layer 410 present above the top of dummy gate 110.

Once hard mask 170 and the desired portion of metal layer 410 are removed, dummy gate 110 is replaced with gate structure 500. Gate structure 500 is used to control the operation of the current nano-ribbon transistor device by altering the electric field applied to channel 130. The process of replacing dummy gate 110 with gate structure 500 includes selectively etching dummy gate 110 using, for example, RIE, depositing a gate high-k dielectric layer, depositing the material of which the metal gate is to be formed, and planarizing the top of gate structure 500 to be even with the top of interlayer dielectric 150 and spacers 160. It should be appreciated that in some embodiments, gate structure 500 will include a gate dielectric layer (not shown) to prevent direct conduction between gate structure 500 and channel 130. In a preferred embodiment, this gate dielectric is composed of hafnium oxide ($HfO_2$), Aluminum oxide ($Al_2O_3$), tantalum oxide (TaO), titanium oxide (TiO), lanthanum oxide (LaO), or any other insulative material. In a preferred embodiment, the metal gate is composed of titanium nitride (TiN), tantalum nitride (TaN), aluminum (Al), or tungsten (W), or any other metal deposited using, for example, atomic layer deposition (ALD). Other materials of which the metal gate may be formed includes, but is not limited to, tungsten, titanium, or any other metal. In general, gate structure 500 is formed such that gate structure 500 takes the same geometric form of dummy gate 110 as depicted in FIG. 5.

Once dummy gate 110 is replaced with gate structure 500, interlayer dielectric 550 is deposited. Interlayer dielectric 550 is used to electrically insulate the current nano-ribbon transistor device from outside electrical components. In a preferred embodiment, interlayer dielectric 550 is composed of silicon dioxide, deposited using, for example, low pressure chemical vapor deposition (LPCVD). Other materials of which interlayer dielectric 550 may be formed include, but are not limited to, doped carbon, silicon oxynitride, or any other insulative material. In general, interlayer dielectric 550 extends between 20 nm and 150 nm vertically from the top of dummy gate 110. A person of ordinary skill in the art will recognize that chemical-mechanical planarization (CMP) steps may be required after the deposition of the material of which interlayer dielectric 550 is formed to planarize the top of interlayer dielectric 550 such that the top of interlayer dielectric 550 is relatively flat.

Contacts 510, 520, 530, and 540 are used to electrically connect the current nano-ribbon transistor device to outside electrical components including but not limited to other nano-ribbon transistor devices, additional electrical components such as capacitors and resistors, or any other electrical components. In a preferred embodiment, contacts 510, 520, 530, and 540 are composed of copper and deposited using plating techniques well known in the art. Other materials of which contacts 510, 520, 530, and 540 may be formed include, but are not limited to, tungsten, titanium, or any other metal or combination of metals. In general, contacts 510, 520, 530, and 540 extend vertically from the top of source and drain regions 120 to the top of interlayer dielectric 550. A person of ordinary skill in the art will recognize that chemical-mechanical planarization (CMP) steps may be required after the deposition of the material of which contacts 510, 520, 530, and 540 are formed to planarize the top of contacts 510, 520, 530, and 540 such that the top of contacts 510, 520, 530, and 540 are even with the top of interlayer dielectric 550 and no portions of contacts 510, 520, 530, and 540 are present above the top of interlayer dielectric 550. In the depicted embodiment, contact 510 functions as a contact for the source terminal of the nano-ribbon transistor device and contact 520 functions as a contact for the drain terminal for the nano-ribbon transistor device. Contact 530 functions as a contact for the gate terminal of the nano-ribbon transistor device which is used to turn the flow of current between the source and drain terminals of the device off and on. Contact 540 functions as a contact for metal layer 410 which is used to control the threshold voltage of the device. In general, changing the threshold voltage of the device changes the voltage which must be applied to the gate terminal of the device in order to turn the flow of current between the source and drain terminal off or on.

In some embodiments the threshold voltage of the nano-ribbon transistor device of the invention is modified by changing the voltage applied to the back bias terminal of the device such as contact 540. In other embodiments, the desired threshold voltage is modified by selecting the material of which metal layer 410 is formed such that when a known voltage is applied to contact 540, the desired change in the threshold voltage of the device is achieved. In these embodiments, the voltage applied to the contact 540 of many devices does not need to be varied while different work functions of the material of which metal layer 410 is formed in each device produce the desired changes in the threshold voltage for each device.

In various embodiments of the invention the gate structure can be formed utilizing a gate-first or a gate-last process. In a gate-first process, the gate structure is formed first followed by the source/drain regions and optionally, merging of each of the source/drain regions.

In a gate-last process such as the embodiment depicted in FIGS. 1-7, the gate structure is formed after source/drain regions are formed. In such a process, a sacrificial gate material such as dummy gate 110 is formed around channel 130 and then source regions can be formed into exposed portions of channel 130 on one side of the sacrificial gate structure and then drain regions can be formed in exposed portions of channel 130 on the other side of the sacrificial gate structure. Next, the sacrificial gate structure may be replaced with a gate structure as defined above. In general, the gate structure is used to control output current (i.e., flow of carriers in the channel) of a semiconducting device through electrical or magnetic fields.

Figure 6:
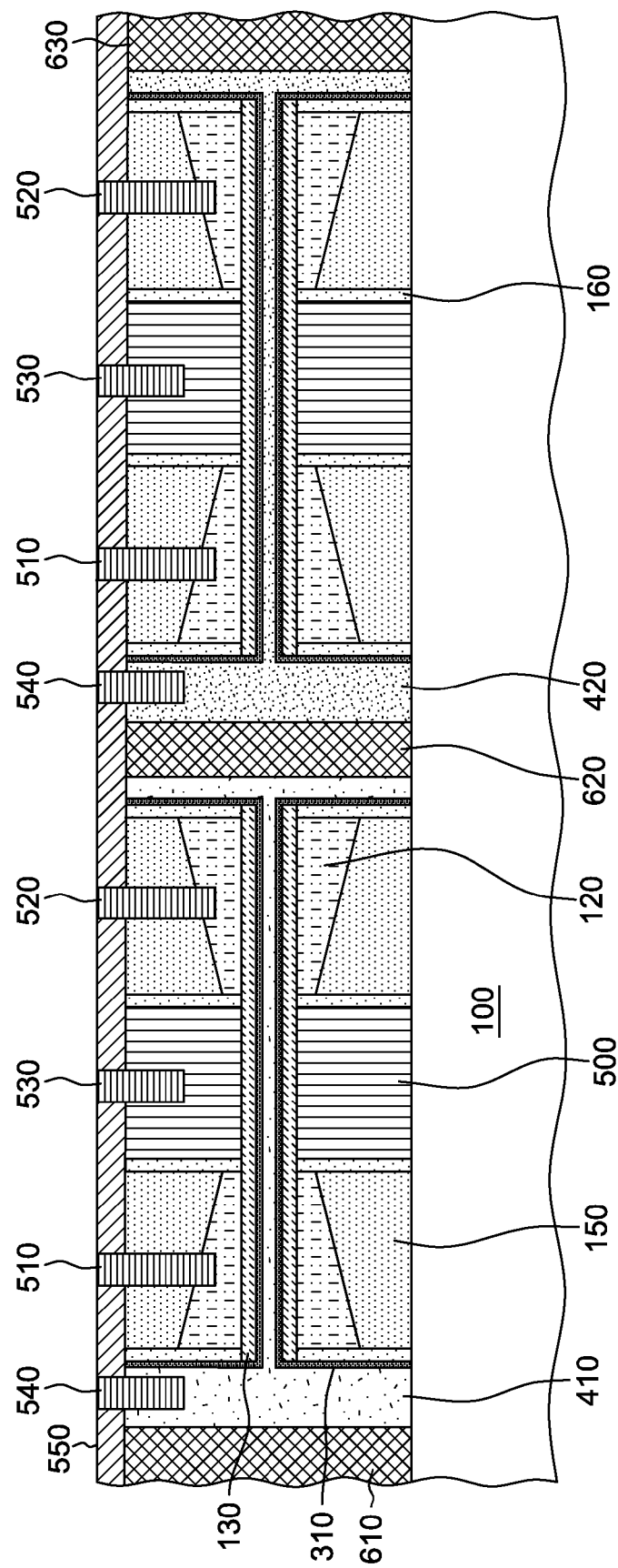
FIG. 6 illustrates an embodiment of the invention where multiple nano-ribbon transistor devices are formed alongside each other in an environment where components are not manufactured at pitch, in accordance with an embodiment of the invention.

FIG. 6 depicts a section view of an embodiment of the invention where two nano-ribbon transistor devices with two different threshold voltages are formed next to each other using different materials for metal layer 410 and metal layer 420. In one embodiment, the same voltage is applied to the contact 540 of each device, and the differences in the work functions of the materials of which metal layer 410 and metal layer 420 are formed in each device produce the desired difference in the threshold voltage of the devices. In one embodiment, metal layer 410 is composed of Aluminum while metal layer 420 is composed of titanium. In this embodiment, due to the differences in the work functions of aluminum and titanium, each of the nano-ribbon transistor devices will have different threshold voltages when the fabrication of the devices is completed and the same voltage is applied to the contact 540 of each device. As depicted, neighboring devices are isolated from each other using isolation regions such as isolation regions 610, 620, and 630. In various embodiments, isolation regions 610, 620, and 630 can be composed of silicon dioxide, silicon nitride, or any other insulating material. It should be appreciated by one skilled in the art that additional processing steps including the use of additional hard masks may be required to form metal layers such as metal layer 410 and metal layer 420 from different materials in neighboring devices. Additionally, it should be appreciated that the process of isolating a device from neighboring devices is well known in the art and that any acceptable method of isolating one or more transistors for a series of processing steps can be used in various embodiments of the invention.

Figure 7:
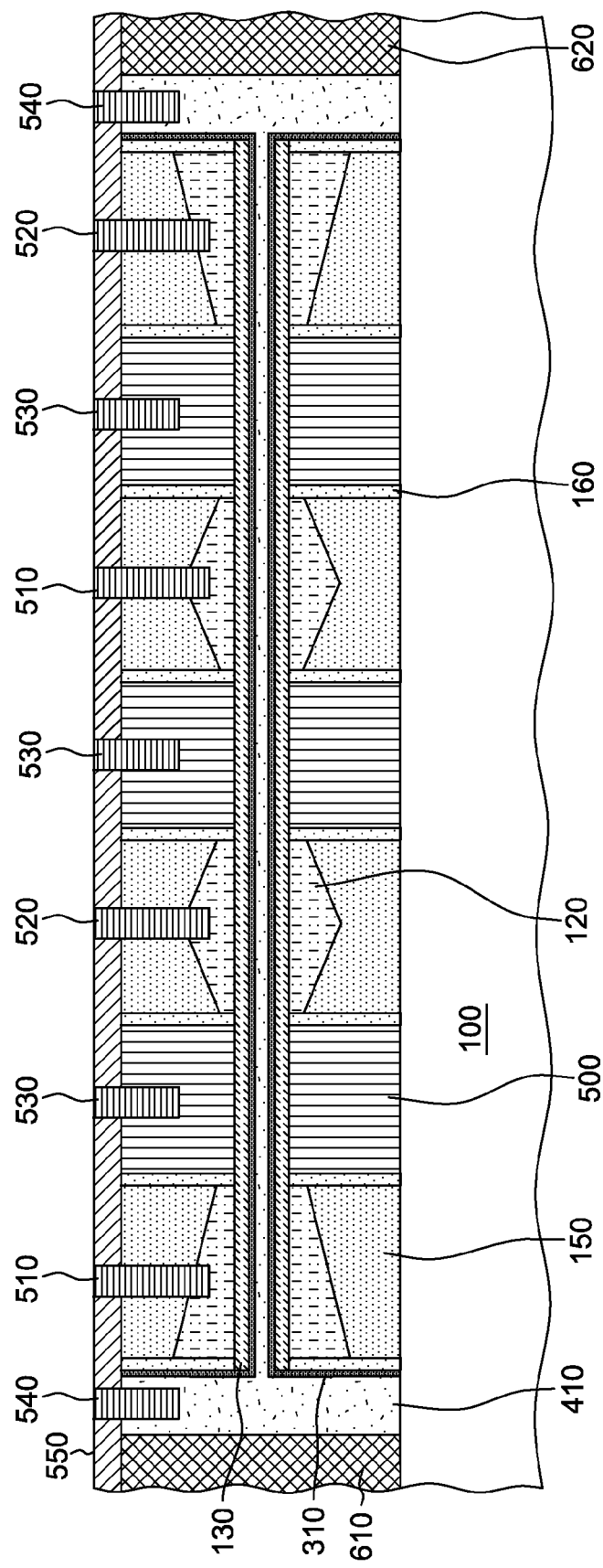
FIG. 7 illustrates an embodiment of the invention where multiple nano-ribbon transistor devices are formed alongside each other in an environment where components are manufactured at pitch, in accordance with an embodiment of the invention.

FIG. 7 depicts a section view of an embodiment of the invention where multiple nano-ribbon transistor devices are manufactured "at pitch" and all of the connected nano-ribbon transistor devices are required to have the same threshold voltage, in accordance with an embodiment of the invention. It should be appreciated that the embodiment depicted in FIG. 6 describes embodiments where the density of electrical components such as the nano-ribbon transistor device of the invention is not required to be extremely high, while the embodiment depicted in FIG. 7 describes embodiments where the density of electrical components such as the nano-ribbon transistor device of the invention is required to be extremely high, such as the production of microprocessors or compact memory components.

In general, in embodiments where multiple nano-ribbon transistor devices are manufactured "at pitch", a single source or drain region such as source drain region 120 acts as either a source or drain region for both of the nano-ribbon transistor devices located on either side of the source drain region. It should be appreciated by one skilled in the art that the practice of using shared source and drain regions in "at pitch" manufacturing of transistor devices is well known in the art, and that any method for implementing a shared source and drain can be used.

In some embodiments, due to the long and narrow properties of the gap within dielectric layer 310 which must be filled with metal layer 410, the number of nano-ribbon transistor devices which can be manufactured alongside each other is limited due to the difficulty with effectively filling the interior of dielectric layer 310 with metal layer 410. In some embodiments where too many nano-ribbon transistor devices are formed alongside each other, the process of filling the interior or dielectric layer 310 "pinches off" and the ends of the gap are filled before the middle of the gap is completely filled, making it impossible to completely fill the gap within dielectric layer 310. In embodiments where the interior or dielectric layer 310 must be completely filled in order for the nano-ribbon transistor devices to function correctly, the maximum number of nano-ribbon transistor devices which can be formed alongside each other is determine by the following formula:

$$N = \text{floor}(R*t/\text{CPP}) - 1 \qquad (1)$$

In formula (1), "N" represents the number of nano-ribbon transistor devices which can be formed alongside each other. Additionally, in formula (1) "R" represents the maximum fill aspect ratio, or the ratio between the length of the gap between dielectric layer 310 and the width of the gap between dielectric layer 310 which can be filled effectively using a given technique for filling the gap with metal layer 410. In one embodiment, it is determined that using a process such as ALD to fill the gap between dielectric layer 310, a maximum aspect ratio of 15 can be filled. In formula (1), "t" represents the width of the gap between dielectric layer 310, as measured in nanometers. In formula (1), "CPP" represents the gate pitch, or the measured distance between the center of the gate terminals of adjacent nano-ribbon transistor devices. In formula (1), the function "floor( )" is used to round down the value included in the parentheses to the lowest whole integer value included. For example, the value of "floor(3.359)" would be three, while the value of "floor(2.9987)" would be two. In one embodiment where "R" is determined to have a value of 15, "t" is determined to have a value of 30 nanometers, and "CPP" is determined to have a value of 45 nanometers, the maximum number of nano-ribbon transistor devices which could be formed alongside each other is determine to be equal to floor ((15*30)/45)−1, or a total of nine devices.

In some embodiments, the entire length of the gap within dielectric layer 310 does not need to be completely filled, but only partially filled in order for the device to operate correctly. In these embodiments, formula (1) is still used, however the value of "R" is modified to reflect the need to only partially fill the gap within dielectric layer 310. For example, in one embodiment where ALD is used to fill the gap within dielectric layer 310, but the entire length of the gap must be only partially filled with metal layer 410, the value of "R" is changed from 15 to 30. In this embodiment, "R" is increased because the ALD process can partially fill a longer and narrower gap (a gap with a higher aspect ratio) than it can completely fill. Due to the change in the value of "R", the number of nano-ribbon transistor devices which could be formed alongside each other increases from a total of nine to a total of nineteen.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described embodiments of a method for forming a nano-ribbon transistor device and the resulting structure (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A semiconductor device comprising:
   a substrate;
   a nano-ribbon channel formed above the substrate and around a core;
   a gate formed around the nano-ribbon channel;
   one or more spacers formed laterally on at least one sidewall of the gate;
   a back-bias control region formed in at least the core of the nano-ribbon channel;
   a dielectric layer formed between the nano-ribbon channel and the back-bias control region;

a source/drain region epitaxially formed circumferentially around the nano-ribbon channel adjacent to each spacer of the one or more spacers; and a metal contact formed in the back-bias control region, wherein the metal contact is used to apply a voltage to the back-bias control region.

2. The semiconductor device of claim 1, wherein the substrate includes a buried oxide layer (BOX).

3. The semiconductor device of claim 1, wherein the nano-ribbon channel comprises a III-V semiconductor material.

4. The semiconductor device of claim 1, wherein the gate includes a gate dielectric layer.

5. The semiconductor device of claim 1, wherein the back-bias control region comprises an electrically conductive material.

6. The semiconductor device of claim 1, wherein the application of a voltage to the back-bias control region results in a change in the threshold voltage of the semiconductor device.

7. The method of claim 1, wherein the source/drain region is laterally adjacent to each spacer of the one or more spacers.

* * * * *